US006848089B2

(12) United States Patent
Galland et al.

(10) Patent No.: US 6,848,089 B2
(45) Date of Patent: Jan. 25, 2005

(54) METHOD AND APPARATUS FOR DETECTING DEVICES THAT CAN LATCHUP

(75) Inventors: Micah S. Galland, Enosburg Falls, VT (US); Peter A. Habitz, Hinesburg, VT (US); Steven E. Washburn, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/209,144

(22) Filed: Jul. 31, 2002

(65) Prior Publication Data

US 2004/0025128 A1 Feb. 5, 2004

(51) Int. Cl.[7] .............................. G06F 9/45; G06F 17/50
(52) U.S. Cl. ............................................... 716/5; 716/4
(58) Field of Search .............................. 716/1–6, 8–11; 257/203–206, 372, 355, 373

(56) References Cited

U.S. PATENT DOCUMENTS

| | | | | |
|---|---|---|---|---|
| 4,353,105 A | | 10/1982 | Black | 361/101 |
| 4,571,505 A | | 2/1986 | Eaton | 307/297 |
| 4,660,067 A | * | 4/1987 | Ebina | 257/373 |
| 5,063,429 A | * | 11/1991 | Crafts | 257/203 |
| 5,402,358 A | * | 3/1995 | Smith et al. | 716/9 |
| 5,901,065 A | * | 5/1999 | Guruswamy et al. | 716/8 |
| 5,942,932 A | | 8/1999 | Shen | 327/530 |
| 5,987,086 A | * | 11/1999 | Raman et al. | 716/1 |
| 6,114,731 A | * | 9/2000 | London | 257/355 |
| 6,421,818 B1 | * | 7/2002 | Dupenloup et al. | 716/18 |
| 6,550,047 B1 | * | 4/2003 | Becker | 716/8 |
| 6,553,542 B2 | * | 4/2003 | Ramaswamy et al. | 716/2 |
| 6,560,753 B2 | * | 5/2003 | Barney et al. | 716/2 |

FOREIGN PATENT DOCUMENTS

| | | |
|---|---|---|
| JP | 2172270 | 7/1990 |
| JP | 3106068 | 5/1991 |
| JP | 8255872 | 10/1996 |

OTHER PUBLICATIONS

Kuroda, T. et al., "Substrate noise influence on circuit performance in variable hreshold–voltage scheme", Low Power Electroni and Design, 1996., International Symposium on, Aug. 12–14, 1996. pp.:309–312.*
Hoi–Jun Yoo, "High speed latchup resistant CMOS data output buffer for submicrometre DRAM application",Electronics Letters vol.: 32, Issue: 24 , Nov. 21, 1996. pp.:2229–2230.*
Yoshimoto, M. et al., "A latch–up–free CMOS RAM cell with well–source structure", Solid–State Circuits, IEEE Journal of , vol.: 22 , Issue: 4 , Aug. 1987. pp.:538–542.*
Donoghue, B. et al. "A 256K HCMOS ROM using a four–state cell approach", Solid–State Circuits, IEEE Journal of , vol.: 20 Issue: 2 , Apr. 1985. pp.:598–602.*
Voldman, S. et al. "Retrograde well and epitaxial thickness optimization for shallow and deep–trench collar merged isolation an node trench SPT DRAM cell and CMOS logic technology", Electron Devices Meeting, 1992. Technical Digest., International , 1 16.*
J.G. McLean, "Technique For Performing Module–Level Automated Testing For CMOS Latch–Up", IBM Tech. Disc. Bull., vol. 29, No. 4, Sep. 1986.

* cited by examiner

*Primary Examiner*—Leigh M. Garbowski
*Assistant Examiner*—Naum Levin
(74) *Attorney, Agent, or Firm*—Richard A. Henkler

(57) ABSTRACT

A method and apparratus for for identifying circuits within an integrated circuit design that are likely to latchup. The present invention accomplishes the identification by searching for suspect circuits and then modifying these circuits to represent a device known by an EDA tool (e.g. FET device). The EDA tool can then be used to determine the likelihood of latchup occuring based upon the modified device.

18 Claims, 3 Drawing Sheets

METHOD AND APPARATUS FOR DETECTING DEVICES THAT CAN LATCHUP

BACKGROUND

1. Technical Field of the Present Invention

The present invention generally relates to semiconductor devices, and more particularly, to methods and apparatuses that analyze such semiconductor devices for circuits that can latchup.

2. Description of Related Art

The ever decreasing size of electronic components and their internal structures has resulted in making it easier to either completely destroy or otherwise impair electronic components from latchup. Latchup is when a pnpn structure transitions from a low current high voltage state to a high current low voltage state through a negative resistance region (i.e. forming an S-Type I-V (current/voltage) characteristic).

Latchup is typically understood as occurring within a pnpn structure, or Silicon Controlled Rectifier (SCR) structure. Interestingly enough, these pnpn structures can be intentionally designed, or even unintentionally formed between structures. Hence, latchup conditions can occur within peripheral circuits or internal circuits, within one circuit (intra-circuit) or between multiple circuits (inter-circuit).

Latchup is typically initiated by an equivalent circuit of a cross-coupled pnp and npn transistor. With the base and collector regions being cross-coupled, current flows from one device leading to the initiation of the second ("regenerative feedback"). These pnp and npn elements can be any diffusions or implanted regions of other circuit elements (e.g. P-channel MOSFETs, N-Channel MOSFETs, resistors, etc) or actual pnp and npn bipolar transistors. In CMOS, the pnpn structure can be formed with a p-diffusion in a n-well, and a n-diffusion in a p-substrate ("parasitic pnpn"). In this case, the well and substrate regions are inherently involved in the latchup current exchange between regions.

The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacings (e.g. Base width of the npn and base width of the pnp), current gain of the transistors, substrate resistance and spacings, the well resistance and spacings, and isolation regions.

Many techniques for avoiding latchup conditions in circuits have been developed over the last 30 years. However, the ability to use EDA tools to identify the circuits in which latchup is likely to occur has been limited by time and computer processing constraints.

It would, therefore, be a distinct advantage to have a method and apparatus for quickly and easily identifying circuits in which latchup is likely to occur. The present invention provides such a method and apparatus.

SUMMARY OF THE PRESENT INVENTION

The present invention is a method and apparratus for identifying circuits within an integrated circuit design that are likely to latchup. The present invention accomplishes the identification by searching for suspect circuits and then modifying these circuits to represent a device or shape known/recognizable by an EDA tool (e.g. FET device). The EDA tool is then used to execute specialized code for latchup analysis when this recognizable shape is identified.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

Figure 1:
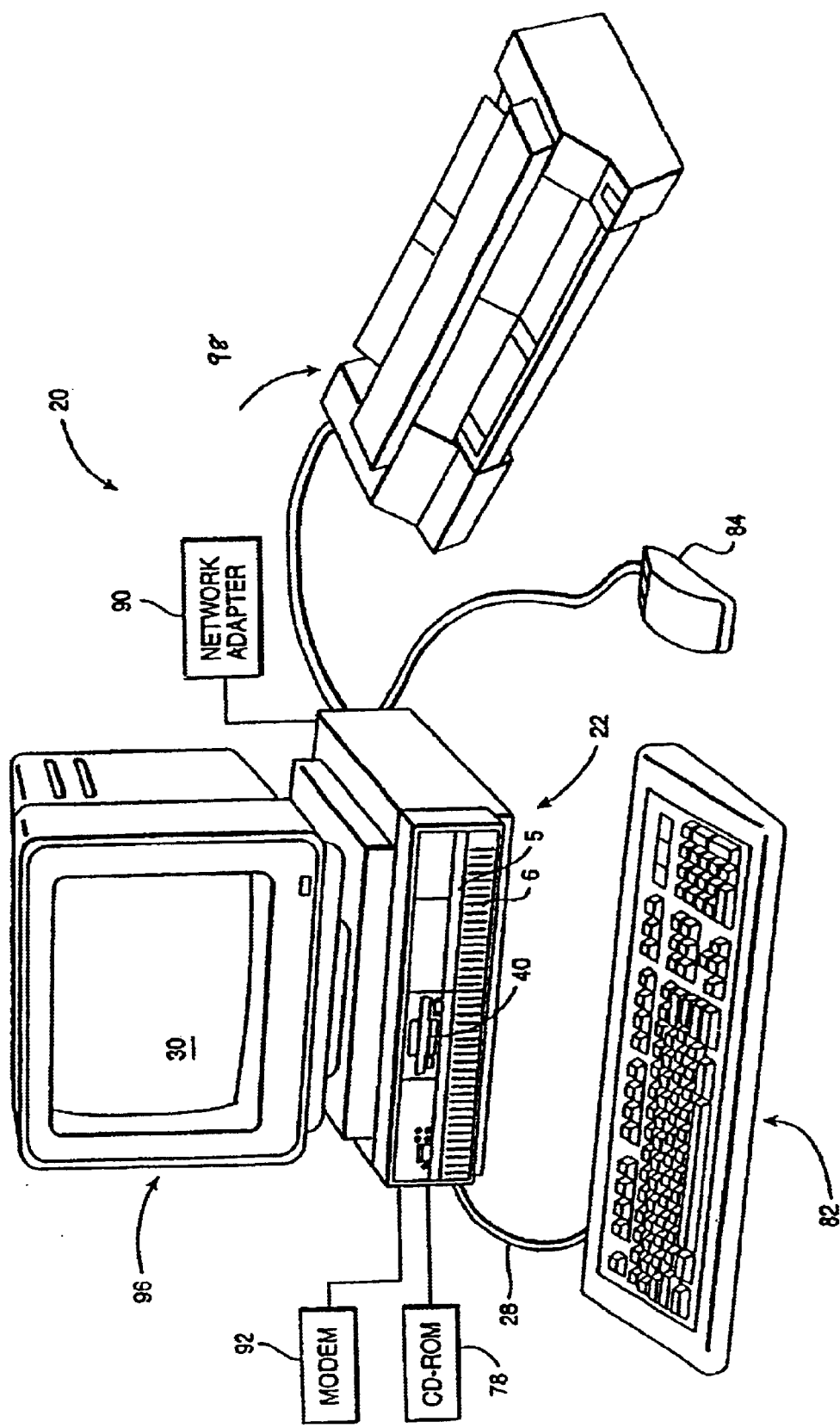
FIG. 1 is a diagram of a data processing system in which the present invention can be practiced

FIG. 1 is a diagram of a data processing system 20 in which the present invention can be practiced. The data processing system 20 includes processor 22, keyboard 82, and display 96. Keyboard 82 is coupled to processor 22 by a cable 28. Display 96 includes display screen 30, which may be implemented using a cathode ray tube (CRT) a liquid crystal display (LCD) an electrode luminescent panel or the like. The data processing system 20 also includes pointing device 84, which may be implemented using a track ball, a joy stick, touch sensitive tablet or screen, track path, or as illustrated a mouse. The pointing device 84 may be used to move a pointer or cursor on display screen 30. Processor 22 may also be coupled to one or more peripheral devices such as modem 92, CD-ROM 78, network adapter 90, and floppy disk drive 40, each of which may be internal or external to the enclosure or processor 22. An output device such as printer 98 may also be coupled with processor 22.

As previously stated, a latchup structure (circuit) is a structure in which a p-type diffusion within an NWELL and a neighboring n-type diffusion outside of the NWELL are close enough to each other and far enough away from a contact, to allow an unintended current to flow from one to the other.

Figure 2:
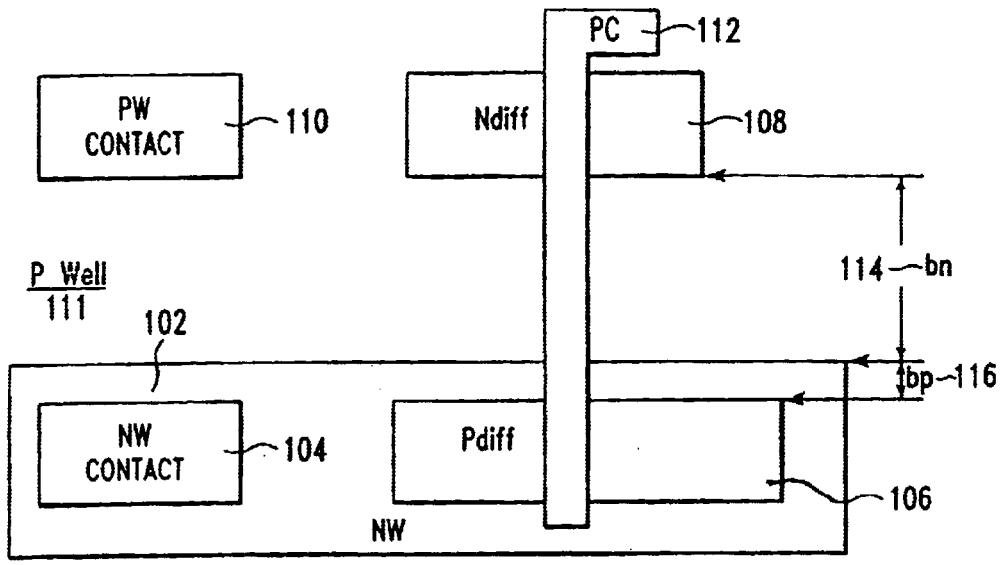
FIG. 2 is a schematic diagram illustrating a circuit in which latchup can occur.

FIG. 2 is a schematic diagram illustrating a circuit 100 in which latchup can occur. Specifically, the circuit 100 includes a P WELL (PW) contact 110 which connects to the Pwell 111 or in this type technology substrate region, a NWELL 102, contacted via a NWELL contact (NW contact) a P diffusion (Pdiff) 106 located in the NWELL 102, a N diffusion (Ndiff) 108 located outside of the NWELL within the PWELL, and a Polysilicon gate structure (PC) 112 limiting the diffusion area on one side. The PC 112 structure is not necessary for this invention, but clearly shows the most common occurrance of the parasitic situation, which can lead to latchup. The amount of current flowing in this type of structure 100 is dependent upon many facts such as:

1. the bias condition across the bipolar junctions, specifically between the Ndiffusion 108 to the PWELL region 111 and the Pdiffusion 106 to the NWELL region 102;
2. the bias which can be established at WELLs under the junction area of the diffusions depends on the voltage dropp across the resistance from the NW contact 104 to the NW-P junction (not shown) and from the PW contact 110 to the N-PW junction (not shown);
3. the width W 304 (FIG. 4) of the N and P diffusions on both sides of the RX (field oxide, edge of the n and p diffusion), which define the injection area of the lateral SCR structure. This width is set by the smaller of the two parallel injection edges of the device, the minimum of the two measurements (sn 306 and sp 308 FIG. 4); and
4. The basewidths of the interacting NPN and PNP. In other words, the distances from the PW-NW junction to the diffusion edges under the recessed oxide as represented by bn 114 and bp 116.

The present invention can be implemented using and industry standard EDA tool such as Hercules$_{tm}$ produced by Avanti Corporation to perform the parasitic latchup analysis as described below in connection with FIG. 3.

Figure 3:
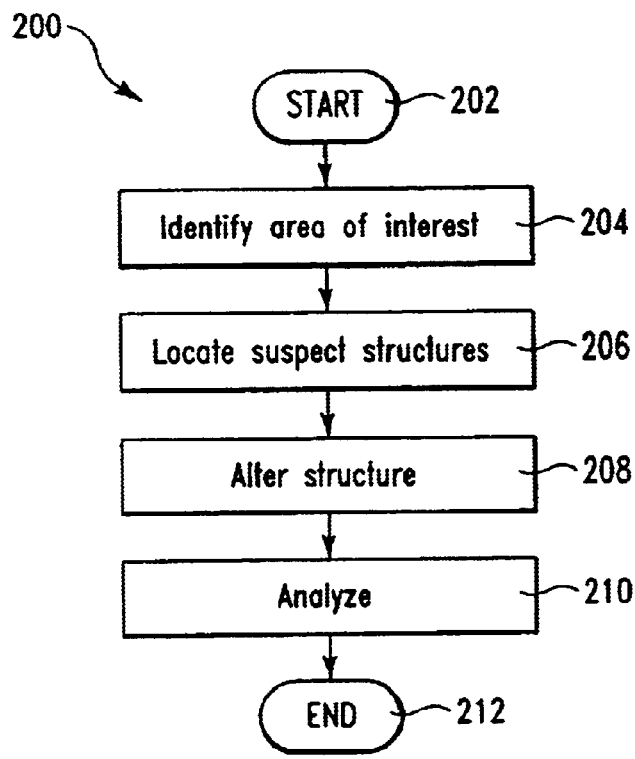
FIG. 3 is a flow chart illustrating the method used for identifying parasitic latchup structures according to the teachings of the present invention.

FIG. 3 is a flow chart 200 illustrating the method used for identifying parasitic latchup structures according to the teachings of the present invention. The method begins at step 202 and proceeds to step 204 (optional) where the designer can identify an area of interest for which the latchup analysis should be performed. If time and processing power are not restraining factors, then the designer can designate the entire integrated circuit as the area of interest.

The method proceeds to step 206 where structures suspected of being likely to latchup are identified. In the preferred embodiment of the present invention, the structures are identified by finding p-type and n-type diffusions within a given distance from one another. Those skilled in the art will readily recognize that various other methods can be used for such identification and are equally applicable to the present invention.

Figure 4:
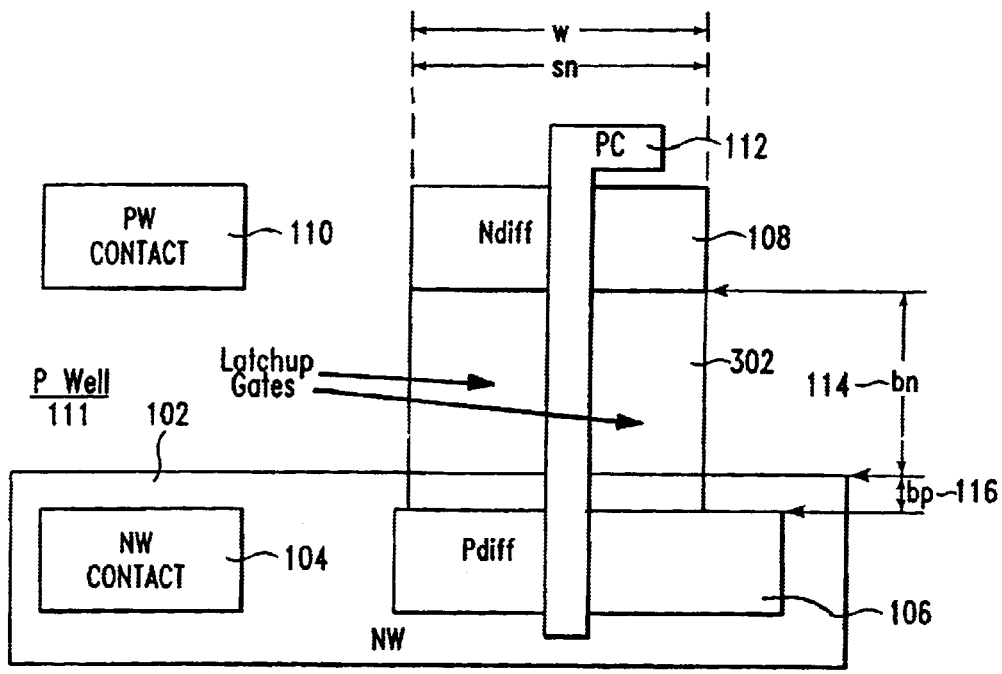
FIG. 4 is a schematic diagram illustrating the modification of the device of FIG. 2 to represent an FET according to the teachings of a preferred embodiment of the present invention.

The method continues to step 208 where the identified structures are altered to resemble a shape recognized by the EDA tool being used, such as an FET as illustrated in FIG. 4. FIG. 4 is a schematic diagram illustrating the modification of the device 100 of FIG. 2 to represent a FET according to the teachings of a preferred embodiment of the present invention. The new shape comprises the edges of parallel N-diffusion and P-diffusion and having a parallel NWELL edge 302 in between. In general, the new shape is trapezeudal in nature. The smallest rectangel within this trapezeudal structure is the new shape created. This shape is comparable with the gate area of an FET type structure, where the source and drain are the Ndiff 108 and P diff 106, respectively. By altering the device to represent a recognizable structure, the EDA code for that recogniable structure (in this case FET) can be altered to support both the traditional model for the FET and a new parasitic latchup model to perform latchup analysis. The implementation of such models can vary widely depending upon the particular application and are well known to those skilled in the art, and therefore, further discussion deemed unneccessary.

The FET recognition code, typically, uses the device structure to find the terminal connections for the Gate and Body nodes of the device model. The present invention creates two new shapes to redefine the functions of these terminals to that of a latchup structure. Specifically, the area between the N diffusion edge and the NW edge(bn114), with the SCR recognition shape is used for the new PWELL contact, and the area between the P diffusion edge and the same NW edge (bp 116) is used as an NWELL contact. As these shapes overlapp the device recognition shape they can function as an analog Gate node and analog Body node in the FET recognition code.

Figure 5:
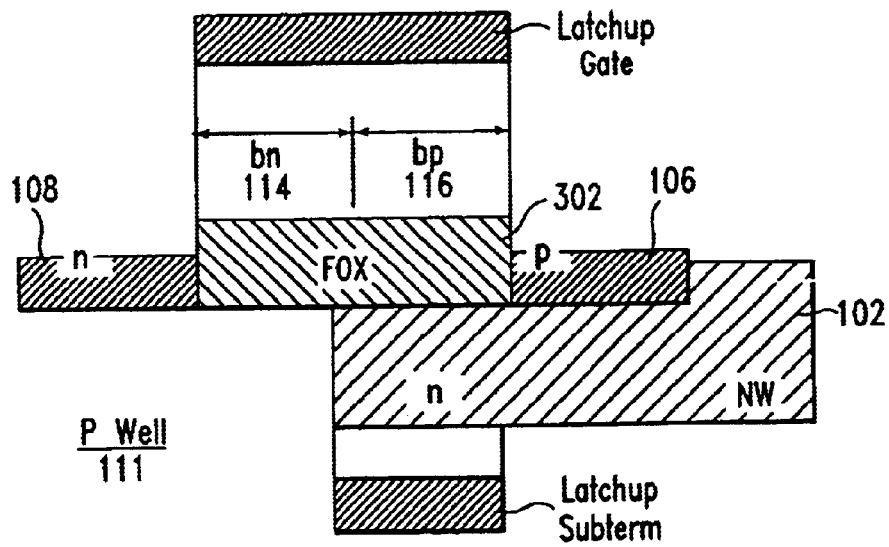
FIG. 5 is a schematic diagram illustrating a planar view of the modified structure 100 of FIG. 4 according to the teachings of a preferred embodiment of the present invention.

The method then proceeds to step 210 where the values for bn 114 and bp 116 are calculated using the EDA tool recognition code for an FET structure. Reference now being made to FIG. 5, a schematic diagram is shown illustrating a planar view of the modified structure 100 of FIG. 4 according to the teachings of a preferred embodiment of the present invention. Bp 116 and bn 114 are now positioned relative to the modified structure 100. The method continues with the EDA tool creating ports for the polysilicon resistive network in the middle of the gate shapes, and ports for diffusion resistance on the edge between the gate and diffusion shapes (not shown). Having identified the four terminals the tool can now call a model for the SCR structure and connect it appropriately. Thereafter, the tool will extract the resistances from the junction terminal created for the parasitic device to the outside terminal 108 and 104. Thereafter, the method proceeds with a circuit analysis of the extracted net work which can show whether destructive latchup current can be created by the designed geometry and the AC and DC operation of the total circuit 100. This analysis ends at step 212 by providing information to the designer concerning the analysis and the likelihood of latchup from such structure.

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

What is claimed is:

1. A method of identifying circuits that are likely to latchup, the method comprising the steps of:
   locating n and p type diffusions within a predefined distance of one another that meet predefined criteria for latchup;
   altering the structures to represent a device recognized by an electronic design automation (EDA) tool, wherein altering includes creating a new shape between an NWELL edge and a p type and n type diffusion edges;
   performing latchup analysis on the altered structures using the EDA tool; and
   identifying circuits that are likely to latchup based upon the latchup analysis.

2. The method of claim 1 wherein the predefined criteria includes p type and n type diffusions within a predefined distance of one another.

3. The method of claim 2 wherein the device is an FET.

4. The method of claim 3 wherein the p and n type diffusion edges are a parallel one to another, the structures include the NWELL edge, and the altering step includes the step of creating the new shape between the NWELL edge and the p and n type diffusion edges, the new shape performing the functions of a gate and body contact, and the n and p diffusions performing the functions of source and drain, respectively.

5. The method of claim 4 wherein the p type diffusion resides in an NWELL.

6. The method of claim 5 wherein the n type diffusion resides outside of the NWELL.

7. An apparatus for identifying circuits that are likely to latchup, the apparatus comprising:

means for locating n and p type diffusions within a predefined distance of one another that meet predefined criteria for latchup;

means for altering the structures to represent a device recognized by an electronic design automation (EDA) tool, wherein altering includes creating a new shape between an NWELL edge and a p type and n type diffusion edges;

means for performing latchup analysis on the altered structures using the EDA tool; and means for identifying circuits that are likely to latchup based upon the latchup analysis.

8. The apparatus of claim 7 wherein the predefined criteria includes p type and n type diffusions within a predefined distance of one another.

9. The apparatus of claim 8 wherein the device is an FET.

10. The apparatus of claim 9 wherein the p and n type diffusion edges are parallel one to another, and the means for altering includes:

means for inserting an NWELL between the p and n type diffusions to perform the function of a gate, and the n and p diffusions performing the functions of source and drain, respectively.

11. The apparatus of claim 10 wherein the p type diffusion resides in an NWELL.

12. The apparatus of claim 11 wherein the n type diffusion resides outside of the NWELL.

13. A computer program product comprising:

a computer usable medium having computer readable program code means embodied in the medium for identifying circuits that are likely to latchup, the computer readable program code means including:

means for locating n and p type diffusions with a predefined distance of one another that meet predefined criteria for latchup;

means for altering the structures to represent a device recognized by an electronic design automation (EDA) tool, wherein altering includes creating a new shape between a NWELL edge and a p type and n type diffusion edges;

means for performing latchup analysis on the altered structures using the EDA tool; and means for identifying circuits that are likely to latchup based upon the latchup analysis.

14. The computer program product of claim 13 wherein the predefined criteria includes p type and n type diffusions within a predefined distance of one another.

15. The computer program product of claim 14 wherein the device is an FET.

16. The computer program product of claim 15 wherein the p and n type diffusion edges are parallel one to another, and the means for modifying includes:

means for inserting an NWELL between the p and n type diffusions to perform the function of a gate, and the n and p diffusions performing the functions of source and drain, respectively.

17. The computer program product of claim 16 wherein the p type diffusion resides in an NWELL.

18. The computer program product of claim 17 wherein the n type diffusion resides outside of the NWELL.

* * * * *